(12) United States Patent
Gierl

(10) Patent No.: US 7,120,404 B2
(45) Date of Patent: Oct. 10, 2006

(54) RADIO RECEPTION SYSTEM WITH AUTOMATIC TUNING

(75) Inventor: Stefan Gierl, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 621 days.

(21) Appl. No.: 09/905,649

(22) Filed: Jul. 13, 2001

(65) Prior Publication Data

US 2002/0022461 A1 Feb. 21, 2002

(30) Foreign Application Priority Data

Jul. 13, 2000 (DE) ................ 100 34 039

(51) Int. Cl.
  *H04B 7/08* (2006.01)
(52) U.S. Cl. ............... 455/132; 455/134; 455/135; 455/136; 455/161.1; 455/154.1; 455/184.1; 455/277.1; 455/277.2; 455/434
(58) Field of Classification Search .......... 455/134, 455/135, 136, 154.1, 184.1, 277.1, 277.2, 455/132, 161.1, 434
See application file for complete search history.

(56) References Cited

U.S. PATENT DOCUMENTS

| 4,450,585 | A | * | 5/1984 | Bell ................ 455/135 |
| 5,203,026 | A | * | 4/1993 | Ekelund ................ 455/134 |
| 5,291,519 | A | * | 3/1994 | Tsurumaru ................ 375/230 |
| 5,345,602 | A | | 9/1994 | Wiedemann et al. ........ 455/137 |
| 5,457,815 | A | | 10/1995 | Morewitz, II ............ 455/161.1 |
| 5,548,836 | A | * | 8/1996 | Taromaru ................ 455/277.1 |
| 5,561,673 | A | * | 10/1996 | Takai et al. ................ 714/708 |
| 6,041,087 | A | | 3/2000 | Inamori ................ 375/348 |
| 6,188,447 | B1 | * | 2/2001 | Rudolph et al. ............ 348/729 |

FOREIGN PATENT DOCUMENTS

| DE | 2 017 869 | 10/1971 |
| DE | 40 17 756 A1 | 12/1991 |
| DE | 41 29 830 C2 | 8/1993 |
| DE | 42 36 621 A1 | 5/1994 |
| DE | 196 18 755 A1 | 11/1997 |
| DE | 689 28 131 T2 | 1/1998 |
| DE | 198 30 608 | 1/2000 |
| EP | 0 767 554 | 4/1997 |
| EP | 0 910 167 A1 | 4/1999 |
| EP | 0 967 746 A2 | 12/1999 |
| EP | 1 056 203 A1 | 11/2000 |
| WO | WO 99/66595 | 12/1999 |

OTHER PUBLICATIONS

Schöpp et al., "Video and Audio Applications in Vehicles Enabled by Networked Systems," *ICCE. International Conference on Consumer Electronics*, pp. 218-219, Jun. 22-24, 1999.
European Search Report.

* cited by examiner

*Primary Examiner*—Quynh H. Nguyen
(74) *Attorney, Agent, or Firm*—O'Shea, Getz & Kosakowski, P.C.

(57) ABSTRACT

A method and apparatus for operating a radio reception system, which comprises a plurality of receivers assigned to a common output device, in which one of the receivers is designated as audio receiver and is tuned to a frequency of a radio transmitter, and outputs a signal received from the transmitter to the output device. At least one second receiver is designated as search receiver, and continuously searches its own reception frequency band for a frequency of the same transmitter. The system changes to a frequency of this transmitter, which was found by the search receiver, if the quality of the signal received by the audio receiver falls below a certain limit.

20 Claims, 3 Drawing Sheets

RADIO RECEPTION SYSTEM WITH AUTOMATIC TUNING

BACKGROUND OF THE INVENTION

The present invention relates to a radio receiving system, and in particular to a vehicle radio reception system that automatically remains tuned to the strongest frequency of a desired transmitter.

Radio receivers with a so-called autobest functionality have been known for some time. These receivers, which are mainly used for car radios, automatically seeks another frequency of the same transmitter and tunes to this frequency, when the reception quality of a transmitter to which they are tuned falls below a certain limit. Even when a driver travels over large distances, which exceed the range of an individual USW broadcast station, he is thus able to continue listening to a transmitter without having to manually seek an alternate frequency when reception on the presently set frequency becomes unsatisfactory.

However, these receivers do not provide uninterrupted listening, since the process of seeking a frequency of the same transmitter can take considerable time, within which the receiver repeatedly tunes to other frequencies and checks whether the transmitter received there is identical to the original one. If such an interruption automatically occurs during a transmission of traffic reports, such as warnings of a traffic jam, etc., this is extremely annoying for the user, even if the interruption takes only a few seconds.

Such interruptions of reception can be avoided by a radio receiving system of the type described in the published German patent application DE 196 18 755 A1. The receiving system disclosed in this published application includes a plurality of autobest receivers, all of which are tuned to the same transmitter and, over a ring, mutually exchange data which contain the reception signal and information about the reception quality of the individual receivers. A receiver that obtains such data from an adjoining receiver on the ring replaces these data by its own reception signal and the associated quality information, if the quality of its own signal is better than that of its adjoining receiver. If its own reception quality is worse, the signal obtained from the adjoining receiver is passed along unchanged. Consequently, the reception signal circulating on the ring is output as an audio signal, and is the best among the reception signals of all the receivers. If the quality of a receiver becomes so bad that it must seek a new reception frequency, this change is inaudible to a user of the radio reception system as long as there are other receivers on the ring that can output a reception signal with satisfactory quality. A problem with this system is that since every receiver seeks an alternative frequency only until it has found one with satisfactory quality, the reception signal circulating on the ring generally does not constantly have the best quality, which is achievable by taking into account all the available frequencies of a transmitter.

Therefore, there is a need for a radio reception system that includes a plurality of radio receivers, configured and arranged to ensure that the receiver configured as an audio receiver is automatically tuned to receive the best possible reception frequency for a desired transmitter.

SUMMARY OF THE INVENTION

Briefly, according to an aspect of the invention, a vehicle radio reception system includes a first receiver that is tuned to receive a signal from a certain transmitter and provide a received signal indicative thereof and a first quality signal indicative of signal strength of the received signal. The radio reception system also includes a second receiver that is automatically scanned through its associated reception range to identify a frequency signal value associated with the transmitter and provide a second quality signal indicative of signal strength of a signal associated with the frequency signal value. The first receiver compares the first quality signal and the second quality signal, and tunes to the frequency signal value if the second quality signal indicates a better signal quality than the first quality signal.

The invention is based on the insight that the conventional autobest search strategy cannot provide optimal results in a radio reception system with several receivers, because it is designed to provide an audio signal again after the shortest possible interruption; but, in a radio reception system with several receivers, this is not required for each individual receiver. This means that, in a radio reception system with several receivers, which distinguishes between an audio receiver, which is supposed to provide an audio signal for the user, and other receivers which do not have to do this, these other receivers can be used for a systematic search for the best possible reception frequency. In one embodiment, a radio reception system includes a plurality of receivers assigned to a common output device, in which one of the receivers is always designated as an audio receiver and is tuned to a frequency of a radio transmitter, and outputs a signal received from the transmitter to the output device. At least one second receiver is designated as a search receiver, and continuously searches its own reception frequency band for a frequency of the same transmitter, and that the system changes to a frequency of this transmitter, which was found by the search receiver, if the quality of the signal received by the audio receiver falls below a certain limit.

The expression "continuous" here is not to be understood in the sense that the search receiver must search nonstop for alternative frequencies of the transmitter to which the audio receiver is tuned. There certainly may be brief stops between two search processes, during which the search receiver is inactive or is used for other tasks. The decisive feature is that the search process does not stop upon finding the first alternative frequency satisfying a given quality requirement, but proceeds so that it necessarily finds the best current frequency of the respective transmitter. A decision can then be made whether or not the system changes to this frequency. The limit value on which this decision is based can be fixed absolutely in conventional fashion, for example in such a way that the system switches to a better reception frequency if the reception field strength or the signal-to-noise ratio falls below a given limit. Such a mode of procedure is appropriate for reception systems with a single receiver, so as to keep the number of reception interrupts small. However, with a reception system with several receivers, according to the invention, the limit can also be fixed relative to the quality of a frequency found by the search receiver. That is, if the frequency found by the search receiver is better than the one currently used by the audio receiver, or if its quality minus a hysteresis value is better than that of the currently used frequency, the reception frequency is changed. In a first embodiment of this method, the search receiver searches the entire frequency band, decides which of the alternative frequencies found therein has the best quality, and reports this frequency to the audio tuner. In this way, the audio receiver is set to the best frequency by a single frequency change. In a second embodiment, the search receiver reports to the audio receiver all the found alternative frequencies (or at least those which are better than the one currently used by the audio receiver), and the audio receiver is switched to the found frequency if it is better. With this design, several frequency changes can indeed take place before the system is set to the best frequency, but reception is improved faster, if possible, because the system need not wait for the end of a complete seek run of the search receiver.

In a radio reception system, the reception frequency can be changed by transmitting to the audio receiver a frequency found by the search receiver, and by tuning the audio receiver to this frequency. Alternatively, the frequency can be changed by transferring the audio receiver function to the previous search receiver, and by tuning the search receiver to the found frequency. In this embodiment, the audio receiver and the search receiver can have the same structure; they only need to be able to switch the operating states belonging to the audio receiver and the search receiver.

The search receiver can include a memory device for storing the found frequencies of a given transmitter and information about the reception quality of the transmitter at each found frequency.

Various receivers of a radio reception system suitably use a data bus (e.g., a Media Oriented Synchronous Transfer (MOST) bus) to exchange information about the reception quality and/or instructions to change the operating state.

Each receiver can have its own antenna associated with it. In such a case, it is suitable to change to a better reception frequency by transferring the audio receiver function to a previous search receiver, since the reception quality which the search receiver with its antenna attains at a given frequency does not necessarily allow conclusions about the reception quality which can be achieved at the same frequency by using the antenna of the present audio receiver.

If each receiver has its own antenna associated with it, it may be advantageous to operate more than one search receiver at the same time so that, when transferring the audio receiver function to another receiver, one has available not only different frequencies but also different antennas.

The inventive radio reception system further can have at least one data receiver for receiving data signals, such as for example RDS, TMC, Swift, DARC, etc. The mode of operation of the data receiver does not necessarily differ from that of the audio receiver; the particular reception signal is only used differently in the radio reception system. Therefore, a search receiver can also be used for the reception frequency of the data receiver, so as to find better alternative frequencies. Data reception is much more sensitive than audio reception to transmission interrupts, since human hearing can interpolate gaps in the range of 100 ms without the listener necessarily being conscious of this. Consequently, in the case of the data receiver, the frequency will be changed when the reception quality falls below an absolute limit rather than below a relative limit, so as to keep the number of frequency changes and thus the possibility of a gap in data reception as low as possible.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
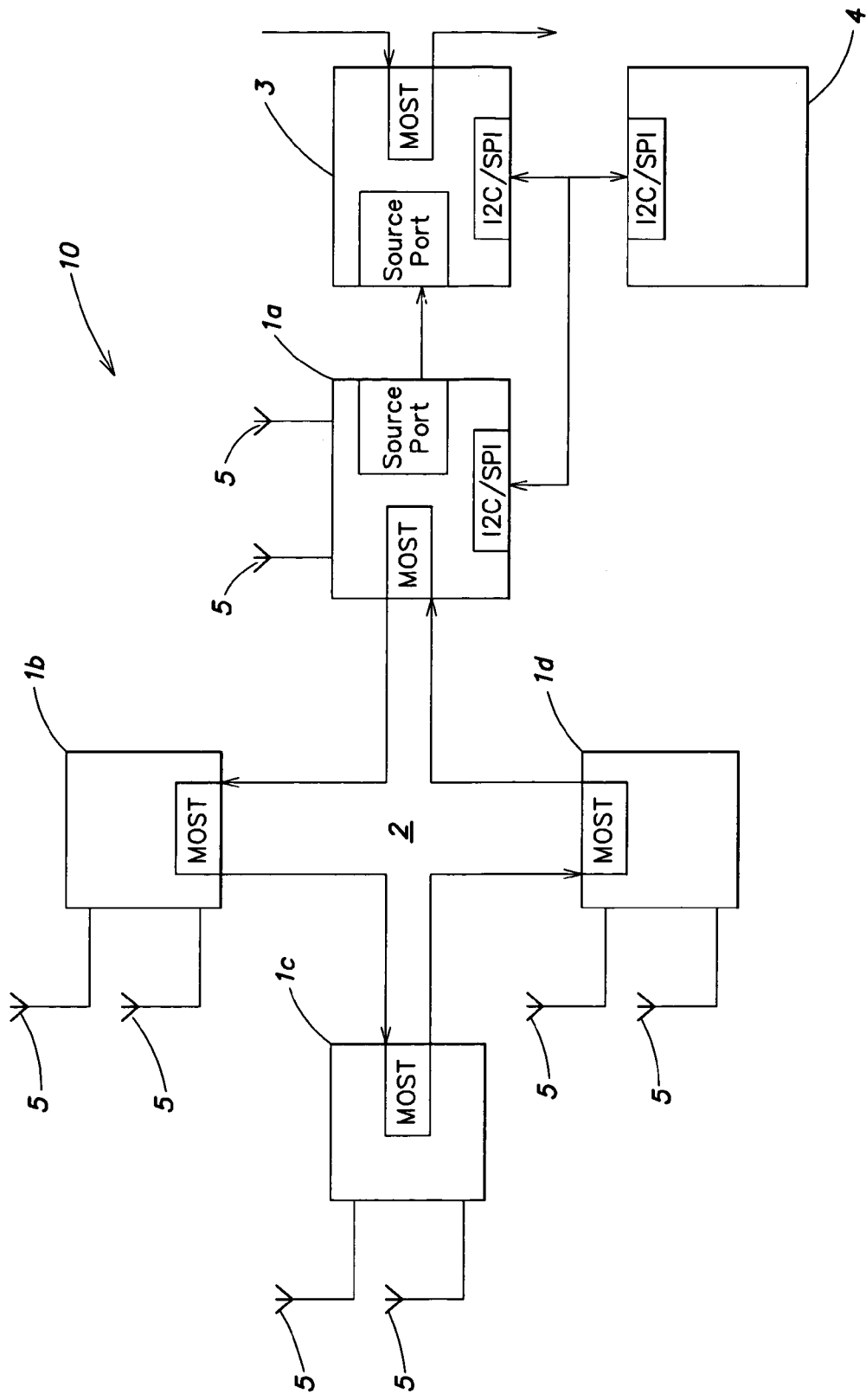
FIG. 1 is a block diagram illustration of a radio reception system.

FIG. 1 illustrates a radio reception system 10 that includes at least two receivers, for example receivers 1a, 1b, 1c, 1d. The individual receivers are connected by a bus 2 (e.g., a MOST ring). On this MOST ring 2, the individual receivers exchange information about the identity of a received transmitter and about reception qualities. An audio signal processing unit 3 is connected to the receiver 1a. This unit 3 amplifies and shapes the spectrum of the audio signal received from the receiver 1a, and provides an output signal to a loudspeaker (not shown). An external microcontroller 4 has input elements so that the user can input control instructions, for example to select a transmitter, regulate the tone, volume, and balance, etc. The microcontroller 4 is connected to the audio signal processing unit 3 and to the receiver 1a. The receiver 1a forwards instructions received from the microcontroller 4 to the MOST ring 2, inasmuch as these instructions concern any of the remaining receivers 1b, 1c, 1d.

Each receiver 1a, 1b, 1c, 1d preferably includes two antennas 5. However, the invention is also applicable to reception systems that have only one antenna per receiver or only one antenna for the entire system.

In one embodiment, the receiver 1a operates as an audio receiver (i.e., it provides the audio signal that is amplified and outputted by the audio signal processing unit 3). Among the other receivers 1b, 1c, 1d, at least one operates as a search receiver, and another one can be a data receiver. The operation of the search receiver will be described with reference to FIGS. 2 and 3.

Figure 2:
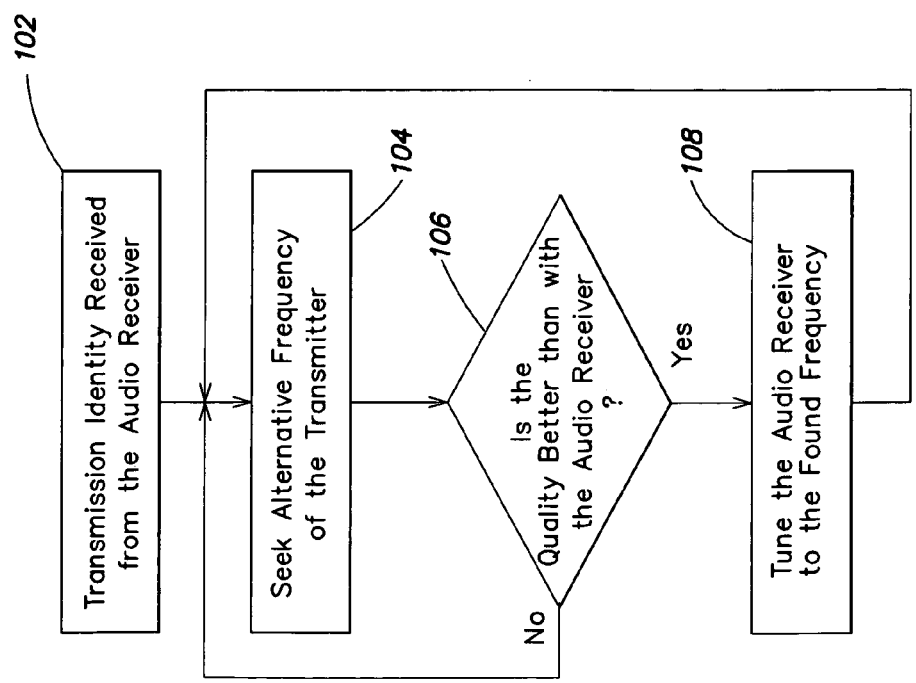

Referring to FIG. 2, in step 102 the search receiver (e.g., receiver 1b) receives a message from the audio receiver 1a about the identity of the transmitter to which the audio receiver 1a is currently tuned. The search receiver 1b then begins in step 104 to seek this transmission frequency on its frequency band. That is, starting from a start frequency, the search receiver 1b performs a search run, tunes to a transmitter with a neighboring frequency, and by a PI code transmitted by the transmitter, decides whether or not this is the transmitter specified by the audio receiver. If not, the search is continued. If yes, in step 106 the search receiver 1b decides whether the reception quality at the frequency found by the search receiver 1b is better than the one currently being received by the audio receiver 1a. This decision can be made for example by the search receiver 1b reporting the frequency and the reception quality to the audio receiver 1a, which decides whether it is advantageous to switch to the new-found frequency. Alternatively, the audio receiver 1a can circulate a message on the MOST ring 2 specifying the quality of the signal which it is currently receiving, so the search receiver 1b can make the decision whether or not to make a switch and, when appropriate, can transmit a switching instruction to the audio receiver 1a.

A switch takes place when the quality of the frequency found by the search receiver 1b exceeds that of the audio receiver 1a by a prescribed difference. For example, the reception field strength or the signal-to-noise ratio can be used as measurement criteria for the quality.

After the audio receiver 1a has switched to the found frequency in step 108, step 104 is performed again. The steps 102–108 are repeated cyclically until the audio receiver 1a reports a new transmitter identity, causing step 102 to be executed.

Since the search receiver 1b cyclically samples the entire receivable frequency band, it finds the best frequency currently available for the transmitter that is being received, and uses this frequency for reception.

Figure 3:
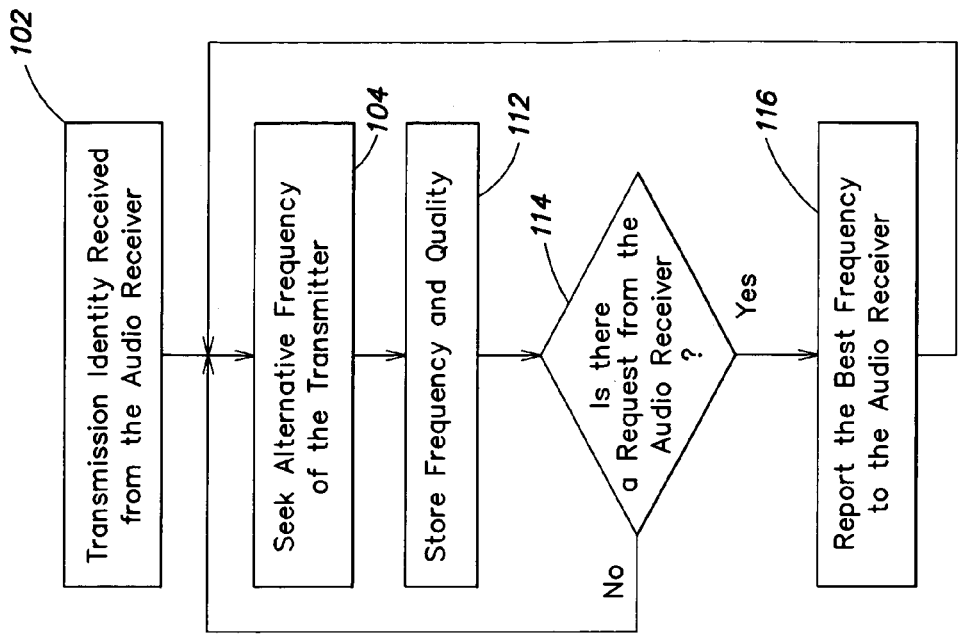
FIGS. 2–4 are flow chart illustrations of various operating techniques of the search receivers of a reception system of the type shown in FIG. 1.

FIG. 3 illustrates another technique for operating the search receiver 1b to identify the best frequency. The technique illustrated in FIG. 3 is substantially the same as the technique illustrated in FIG. 2, with the principal exception that a found transmitter frequency is not directly transmitted to the audio receiver 1a, but in step 112 is stored in a memory element of the search receiver 1b. In this way, the search receiver 1b sets up a table (i.e., a record or database) of all the frequencies on which the transmitter specified by the audio receiver can be received.

Upon receiving a request from the audio receiver 1a in step 114, in step 116 the search receiver 1b reports the currently found best frequency to the audio receiver 1a over the MOST ring 2 and the audio receiver switches to this frequency.

The audio receiver 1a can output a request cyclically, but can also output one when the reception quality currently obtained by the audio receiver falls below a given limit.

The techniques illustrated in FIGS. 2 and 3 are especially suited for reception systems in which all receivers are connected to a common antenna since, in that case, the reception qualities of the search receiver allow safe conclusions about those of the audio receiver. These techniques are also appropriate for a reception system in which several antennas can be selectively connected to each receiver through a coupling field. In such a case, the information to be stored in the table and transmitted to the audio receiver must designate not only the found frequency but also the antenna used to find the transmitter.

In an alternative embodiment reception system, especially appropriate for operation with several antennas, the individual receivers 1a, 1b, 1c, 1d can be switched among several operating states, which include at least operations as an audio receiver and as a search receiver. In the audio receiver operating state, the receiver performs no seek runs, because in this state its function is to deliver as continuously as possible an audio signal to the processing unit 3. On the other hand, during operation as the search receiver, no audio signal is delivered, but a seek run is performed continuously. Another operating state is that of the data receiver. However, for the receiver itself, this state does not differ essentially from the audio receiver operating state, but the signals delivered by the receiver are processed differently in the processing unit 3 for the audio receiver and the data receiver.

Figure 4:
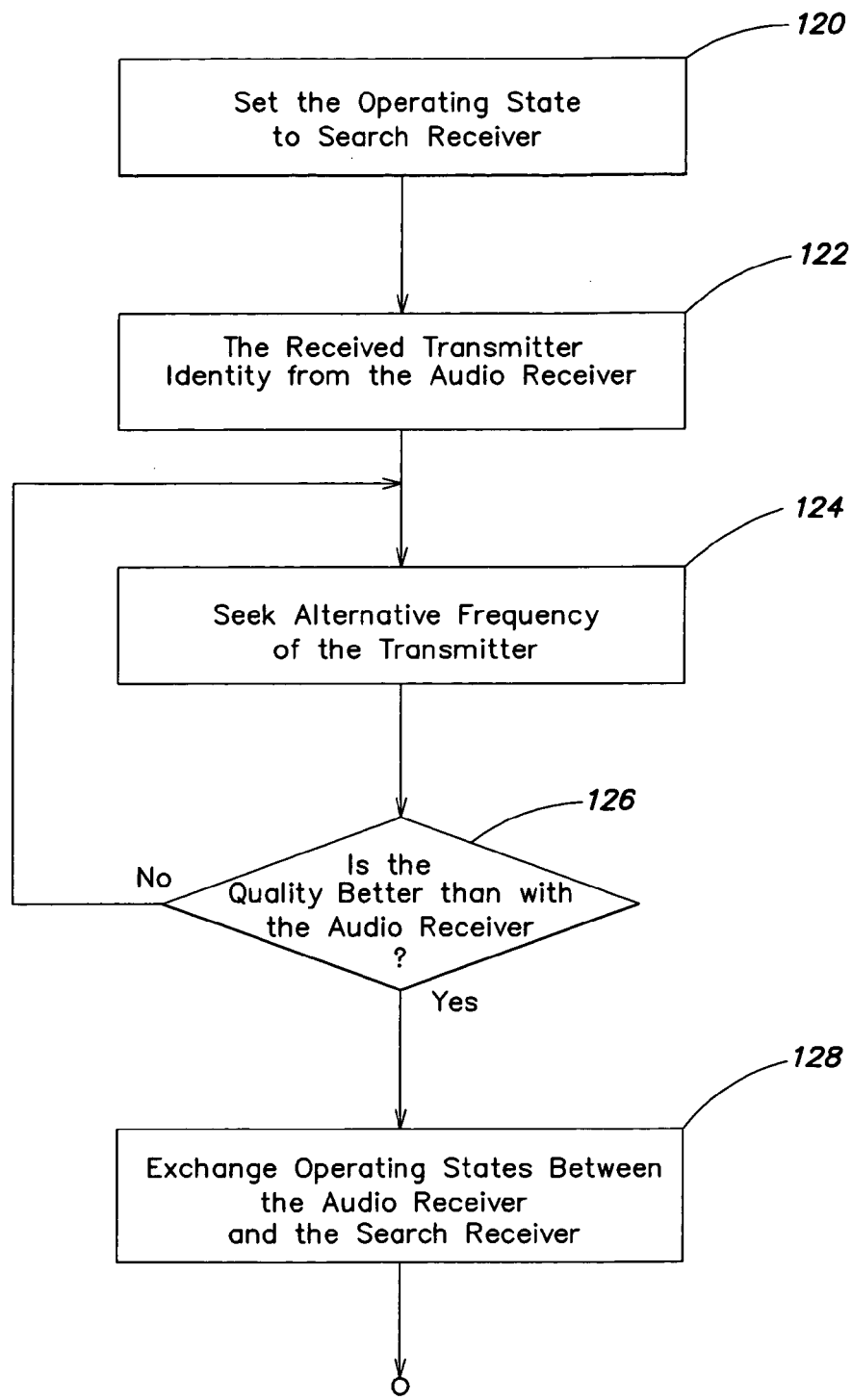

When the reception system 10 is turned on, the microcontroller 4 (FIG. 1) assigns to a receiver (e.g., receiver 1a) the operating state of audio receiver. Other receivers (e.g., the receivers 1b, 1c) receive an instruction to set the operating state of search receiver as illustrated in step 120 (FIG. 4). As in the techniques illustrated in FIGS. 2 and 3, in step 122 the search receivers receive a message about the identity of the transmitter which is to be received. It is contemplated that steps 120 and 122 can be collected into a single step, by addressing the message about the received transmitter to the receiver that is to serve as the search receiver, and by this message being interpreted by the latter receiver as an instruction to operate as the search receiver.

Referring still to FIG. 4, step 124 of seeking the transmission frequencies and step 126 of deciding whether the quality of the found frequency is better than the current quality of the audio receiver, are similar to steps 104 and 106 described with reference to FIG. 2. If it is ascertained in step 126 that the frequency found by the search receiver enables better reception, step 128 is performed and the search receiver transmits an instruction to the audio receiver 1a to transfer to the operating state of search receiver, and on its part assumes the operating state of audio receiver. The audio signal delivered by the new audio receiver, the receiver 1b, is transferred to the MOST ring 2 (FIG. 1), from which the receiver 1a, now operating as search receiver, transfers it to the processing unit 3. With this technique, several search receivers, each one connected to its own antenna 5, and one audio receiver can work together. The receiver whose antenna is able to provide the best signal automatically becomes the audio receiver.

Several antennas 5 can also be associated with each receiver. In that case, the transmitter search of steps 104,106 is always performed alternatingly for the individual antennas.

Of course, with this embodiment of the reception system, it is also possible to equip each of the individual receivers with memory elements for storing reception frequencies and qualities (as well as designation of the associated antenna, if several antennas are associated with the receiver). Upon request of the receiver that is currently operating as the audio receiver, it is possible, as in step 114 of FIG. 3, to check whether other receivers can provide better reception conditions.

In the embodiments, it has been described, among other instances in connection with the function of search tuner, how a transmitter search run is possible in combination with a PI code check for finding alternative frequencies. However, as an alternative to this, one can use the evaluation of the AF list contained in the RDS data stream. This significantly speeds up the process of finding possible alternatives, in that the frequencies in the list are checked first, before starting the transmitter seek run over the entire frequency band.

Although the present invention has been shown and described with respect to several preferred embodiments thereof, various changes, omissions and additions to the form and detail thereof, may be made therein, without departing from the spirit and scope of the invention.

What is claimed is:

1. A method for operating a radio reception system that includes a plurality of receivers assigned to a common output device, where a first one of the receivers is designated as an audio receiver and is tuned to a frequency of a radio transmitter having a transmitter identifier code and outputs a signal received from the radio transmitter to the output device, and where a second one of the receivers is designated as a search receiver, the method comprising:

stepping the search receiver through its frequency band for a frequency signal value associated with the radio transmitter and determining a measure of the signal strength of the frequency signal value;

comparing the signal strength of the signal received by the search receiver and the signal strength of the signal received by the audio receiver;

tuning the search receiver to the frequency signal value if the measure of the signal strength of the frequency signal value is better than the measure of the signal strength associated with the current signal received by the audio receiver such that the search receiver is now designated the audio receiver and assumes the operation thereof and the audio receiver is now designated the search receiver and assumes the operation thereof; and repeating the steps of stepping, comparing and tuning.

2. The method of claim 1, where the step of comparing includes computing the difference between field strengths of the signal received by the search receiver and the signal received by the audio receiver, providing a difference signal value indicative thereof, and comparing the difference signal value to a threshold value.

3. The method of claim 2, where the threshold value comprises a predetermined threshold value.

4. The method of claim 2, where the threshold value is set relative to the quality of a frequency found by the search receiver.

5. The method of claim 1, where the plurality of receivers are connected together in a ring conflauration.

6. A motor vehicle radio reception system, comprising:
a first receiver that performs an audio receiver function by tuning to receive a signal from a transmitter and providing a received signal indicative thereof and a first quality signal indicative of signal strength of the received signal; and
a second receiver that performs a search receiver function by scanning through an associated reception range of the second receiver to identify a frequency signal value associated with the transmitter and providing a second quality signal indicative of signal strength of a signal associated with the frequency signal value;
where the first receiver compares the first quality signal and the second quality signal, and if the second quality signal indicates a better signal quality than the first quality signal the second receiver performs the audio receiver function by tuning to the frequency signal value and the first receiver performs the search receiver function.

7. The motor vehicle radio reception system of claim 6, further comprising a bus to which the first and second receivers are connected and over which the first and second receivers communicate.

8. The motor vehicle radio reception system of claim 6, further comprising an audio processing unit coupled to the first receiver to receive the received signal and provide an output signal indicative thereof.

9. The motor vehicle radio reception system of claim 8, further comprising a controller that provides command signals to the first receiver and to the audio processing unit.

10. The motor vehicle radio reception system of claim 8, where the audio processing unit includes a microprocessor.

11. The motor vehicle radio reception system of claim 6, where the first receiver and the second receiver each include an associated antenna.

12. The motor vehicle radio reception system of claim 7, where the second receiver receives an identification signal over the bus indicative of the transmitter.

13. The motor vehicle radio reception system of claim 7, where the bus comprises a MOST bus.

14. The motor vehicle radio reception system of claim 12, where the first receiver transmits the identification signal onto the bus.

15. A method of operating a radio reception system that includes a plurality of receivers, the method comprising the steps of:
designating a first one of the plurality of receivers as an audio receiver and tuning the audio receiver to a frequency of a transmitter to receive a signal therefrom;
designating a second one of the plurality of receivers as a search receiver and stepping the search receiver through a frequency band for a frequency signal value associated with the transmitter and determining a signal strength of the frequency signal value;
comparing the signal strength of the frequency signal value with a signal strength of the signal received by the audio receiver; and
tuning the search receiver to the frequency signal value if the signal strength of the frequency signal value is greater than the signal strength of the signal received by the audio receiver, and where the search receiver is now designated as the audio receiver and assumes the operation thereof and the audio receiver is now designated as the search receiver and assumes the operation thereof.

16. The method of claim 15, where the steps of stepping, comparing and tuning are repeated in an iterative manner.

17. The method of claim 15, where the step of comparing comprises the steps of:
computing a difference between a field strength of the frequency signal value with a field strength of the signal received by the audio receiver;
providing a difference signal value indicative thereof; and
comparing the difference signal value to a threshold value.

18. The method of claim 17, where the threshold value comprises a predetermined threshold value.

19. The method of claim 17, where the threshold value is set relative to the quality of a frequency found by the search receiver.

20. The method of claim 15, where the plurality of receivers are connected together in a ring configuration.

* * * * *

UNITED STATES PATENT AND TRADEMARK OFFICE
CERTIFICATE OF CORRECTION

PATENT NO.        : 7,120,404 B2
APPLICATION NO.   : 09/905649
DATED             : October 10, 2006
INVENTOR(S)       : Stefan Gierl It is certified that error appears in the above-identified patent and that said Letters Patent is hereby corrected as shown below:

<u>Column 7</u>
In the claims, claim 5, line 10, delete "conflauration" and insert --configuration--

Signed and Sealed this

Nineteenth Day of December, 2006

JON W. DUDAS
*Director of the United States Patent and Trademark Office*